United States Patent [19]
Doke

[11] Patent Number: 5,367,890
[45] Date of Patent: Nov. 29, 1994

[54] INTEGRATED THERMOELECTRIC SYSTEM WITH FULL/HALF WAVE RECTIFIER CONTROL

[75] Inventor: Michael J. Doke, Dallas, Tex.

[73] Assignee: Marlow Industries, Inc., Dallas, Tex.

[21] Appl. No.: 91,833

[22] Filed: Jul. 13, 1993

[51] Int. Cl.⁵ ............................................. F25B 21/02
[52] U.S. Cl. ........................................... 62/3.7; 62/3.3
[58] Field of Search ............................ 62/3.2, 3.3, 3.7

[56] References Cited

U.S. PATENT DOCUMENTS

| | | |
|---|---|---|
| 3,048,020 | 8/1962 | Jones . |
| 3,077,079 | 2/1963 | Peitsch .................... 62/3.7 |
| 3,823,567 | 7/1974 | Corini . |
| 4,326,383 | 4/1982 | Reed et al. . |
| 4,472,945 | 9/1984 | Cech et al. . |
| 4,726,193 | 2/1988 | Burke et al. ............ 62/3.2 |
| 4,744,220 | 5/1988 | Kerner et al. . |
| 4,833,888 | 5/1989 | Kerner et al. . |
| 4,934,150 | 6/1990 | Fessler . |
| 5,209,069 | 5/1993 | Newnan . |
| 5,288,336 | 2/1994 | Strachan et al. . |

FOREIGN PATENT DOCUMENTS

| | | | |
|---|---|---|---|
| 1198837 | 8/1965 | Germany | ............................ 62/3.7 |
| 3020580 | 1/1991 | Japan . | |
| 8101739 | 6/1981 | WIPO . | |
| 8504948 | 11/1985 | WIPO . | |

OTHER PUBLICATIONS

Brochure, Marlow Industries, Inc., "Thermoelectric Products". 1992.

*Primary Examiner*—John M. Sollecito
*Attorney, Agent, or Firm*—Baker & Botts

[57] ABSTRACT

A thermoelectric system which operates on AC input power without requiring external rectification or conditioning is provided. The thermoelectric system includes a thermoelectric device with an integrated rectifier circuit. The thermoelectric device includes a thermoelectric array which may function satisfactorily with 120 volt AC, 240 volt AC or any other desired input power. A control circuit is also provided to allow switching the associated rectifier circuit of the thermoelectric system from full-wave rectification to half-wave rectification. The thermoelectric system may use the control circuit to maintain the temperature of either the hot plate or the cold plate associated with the thermoelectric device at a desired value.

25 Claims, 2 Drawing Sheets

INTEGRATED THERMOELECTRIC SYSTEM WITH FULL/HALF WAVE RECTIFIER CONTROL

TECHNICAL FIELD OF THE INVENTION

This invention relates to thermoelectric devices and more particularly to the use of an integrated thermoelectric system to maintain the temperature of an attached body.

BACKGROUND OF THE INVENTION

The basic theory and operation of thermoelectric devices has been developed for many years. Thermoelectric devices are essentially small heat pumps which follow the laws of thermodynamics in the same manner as mechanical heat pumps, refrigerators, or any other apparatus used to transfer heat energy. The principal difference is that thermoelectric devices function with solid state electrical components (thermocouples) as compared to more traditional mechanical/fluid heating and cooling components. Thermoelectric devices operate using the Peltier effect.

The circuit for a simple thermoelectric device generally includes two dissimilar materials such as N-type and P-type thermoelectric semiconductor elements. The thermoelectric elements are typically arranged in an alternating N-element and P-element configuration. In many thermoelectric devices, semiconductor materials with dissimilar characteristics are connected electrically in series and thermally in parallel. The Peltier effect occurs when voltage is applied to the N-type elements and the P-type elements resulting in current flow through the serial electrical connection and heat transfer across the N-type and P-type elements in the parallel thermal connection.

Modern thermoelectric systems typically include an array of thermocouples which operate by using the Peltier effect to transfer heat energy, an external power supply to convert AC power to DC power to produce the Peltier-type heat transfer with the thermocouple array, and external temperature control circuit. When electrical power is applied to a typical thermoelectric device having an array of thermocouples, heat is absorbed on the cold side of the thermocouples and passed through the thermocouples. A heat sink (sometimes referred to as the "hot sink") is preferably attached to the hot side of the thermoelectric device to aid in dissipating heat from the thermocouples to the adjacent environment. In a similar manner, a heat sink (sometimes referred to as a "cold sink") is often attached to the cold side of the thermoelectric device to aid in removing heat from the adjacent environment. Thermoelectric devices are sometimes referred to as thermoelectric coolers. However, since they are a type of heat pump, thermoelectric devices can function as either a cooler or heater.

In a typical thermocouple array, the direction of heat transfer is indicated by the direction of net current flow through the thermocouples. AC power does not generally affect heat transfer in a thermoelectric devices because AC power normally produces the same amount of current flow in alternating directions through the thermocouple array or essentially zero net current flow. Therefore, AC power, without modification or conditioning, applied to a thermocouple array results in no net transfer of heat energy. A typical thermoelectric device requires DC power in order to produce a net current flow through the thermocouples in one direction. The direction of the current flow determines the direction of heat transfer across the thermocouples. Therefore, the direction of net, non-zero current flow through the thermocouples determines the function of the thermoelectric device as either a cooler or heater.

Traditionally, there are various ways external components have been used to generate this DC power. One way is to drive the thermocouple array directly from a battery or external DC power supply. The external DC power supply often uses a bulky transformer to convert 120 volt or 240 volt AC power to DC power to drive the associated thermoelectric device. In many external DC power supplies, the AC line voltage is reduced using an external transformer. The transformed AC power is then rectified to DC power using an external rectifier circuit. This DC power is then applied to the thermoelectric device to produce the desired heat transfer.

Additionally, whenever it is desired to control the power supplied to the thermoelectric device, an external control circuit has traditionally been used to vary the current flow and resulting heat transfer rate. The external control circuit usually consists of a sensing element to sense the temperature and/or heat transfer rate, a feedback circuit to transfer this temperature or heat transfer information to the control circuit, and a regulator to adjust the net power flow to the thermoelectric device. Controlling the power flow controls the heat transfer rate. Often, the heat-transfer control circuit has used either proportional control, regulating the heat transfer rate by varying the amount of current to the thermoelectric device, or switching control, turning the current to the thermoelectric device off and on as necessary for the desired net heat transfer.

SUMMARY OF THE INVENTION

In accordance with the present invention, apparatus and methods are provided which substantially reduce or eliminate problems and disadvantages associated with previous thermoelectric devices used for transferring thermoelectric energy.

An external circuit has traditionally been used to operate a thermoelectric device. An external power supply has traditionally been used to convert 120 volt AC line power to DC power. Additionally, even if DC power is supplied to a thermoelectric device using an external battery or other DC source, external sense, feedback, control, and switching circuits have has traditionally been used to regulate the heat transfer rate of the thermoelectric device. These methods of heat transfer have several problems. First, an external power supply used to convert 120 volts AC line power to DC power consists of an AC transformer to convert the 120 volts AC to some smaller AC voltage. This external transformer is costly, bulky, inefficient, and an added element of unreliability. Second, an external power supply used to convert 120 volts AC line power to DC power also contains an external rectifier circuit to convert the transformed AC power to DC power. The external rectifier circuit consists of power-switching diodes which have an internal voltage drop and concomitant power loss. This power loss is dissipated by heat which increases the size and cost and decreases the efficiency of the rectifier circuit. Third, the electronic feedback, control, and switching circuit must normally be heatsunk since they are external to the thermoelectric device and in the heated ambient. The temperature rise in these electronic circuits increase their cost and decreases their reliability. Fourth, all of these external devices are expensive because the end user must purchase these components in small quantities and because the end user must then spend valuable resources designing and implementing the circuits' functions. Finally, external circuit require external connections. Since thermoelectric devices normally require large currents to operate, these external connections and external circuits increase the probability of electrical shock to personnel or failure of other external circuits. Accordingly a need has arisen to reduce cost, increase reliability, and increase safety of thermoelectric systems.

In accordance with the present invention, a thermoelectric system is provided which integrates an AC-to-DC power conversion circuit and temperature control circuit into the thermoelectric device. A method of manufacturing these integrated systems and a method of using these integrated systems are provided which substantially eliminate or reduce the disadvantages and problems associated with previous thermoelectric systems.

The present invention provides a thermoelectric system to heat or cool a mass including a thermoelectric device and associated heat sink(s), a rectifier circuit to convert AC power to DC power, a temperature sensor, a feedback circuit for the temperature data, a control circuit for controlling temperature, and a current-switching circuit to switch AC input power. All or part of these elements may be integrated into the thermoelectric device.

In accordance to one aspect of the present invention, a temperature sensor, feedback, and control circuit and a current-switching circuit, may be partially or fully integrated into a thermoelectric device along with an associated heat sink to heat or cool a mass using DC input power.

An important technical advantage of the present invention is that the thermocouple elements are sized, positioned, and interconnected in such a manner as to readily accept rectified AC line-voltage and line-current. By modifying the number of serial electrical connections of thermocouple elements, the total voltage drop of the resulting serial connections is essentially the root-mean-square (RMS) value of fully-rectified 120 volts AC. Additionally, by modifying the size of the thermocouple elements, the total DC current and heat transfer rate are essentially the same as traditional thermocouple devices. A significant advantage of this present invention is that an external AC power transformer, required to convert 120 volts AC to some smaller AC voltage, is eliminated from the thermoelectric system. Eliminating the need to provide an external transformer significantly decreases cost and overall size while increasing reliability and safety of the thermoelectric system.

Another important technical advantage of the present invention is that the rectifier circuit may be integrated into the thermoelectric device. Since the rectifier circuit is integrated into the thermoelectric device, the safety problems associated with exposing these high current diodes has been eliminated. Additionally, the cost of an integrated thermoelectric device and rectifier circuit is less than buying both circuits separately, designing the combined circuits, and allocating valuable circuit space to each. Since in the present invention the rectifier diodes are integrated into the thermoelectric device, the diodes take advantage of the heat-transfer function of the thermoelectric device to improve their heat-transfer rate. Since the diodes can then more efficiently dissipate in the thermoelectric device the heat they generate due to power loss than if they were placed externally; smaller and cheaper diodes, having a smaller heat-transfer coefficient, can be used without increasing their failure rate. This results in further decreased cost and increased reliability of the thermoelectric system.

Another significant technical advantage of the present invention is that the rectifier-mode switching circuit is integrated into the thermoelectric device. The rectifier circuits of the present invention can be switched from full-wave rectification to half-wave rectification. This switching from full to half-wave rectification results in decreased net power to the thermoelectric device and decreased heat-transfer rates. Thus, switching from a full heat-transfer to a lower heat-transfer rate can be used to regulate the temperature of the hot side or the cold side of the thermoelectric device.

In one embodiment of the present invention, the switching is done manually by selecting AC power connections to the thermoelectric device. In another embodiment of the present invention, the rectifier-mode switching is done electrically using an external electrical signal. Still, another embodiment of the present invention implements rectifier-mode switching by an electrical signal from integrated sensing, feedback, and control circuits.

A further technical advantage of the present invention results from the full or partial integration of the thermal sensing, feedback, and temperature control circuits into the thermoelectric device. In the present invention, the thermal sensor, the feedback circuit, the control circuit, and the switching circuit are integrated into the thermoelectric device. Such integration decreases the cost of the thermoelectric system as compared with the parts purchased separately and designed and placed external to the thermoelectric device. Integration also increases the safety of the thermoelectric system because the connections are covered in the thermoelectric device. Additionally, integrating these circuits into the thermoelectric device increases their reliability and efficiency since they can dissipate their heat via the thermoelectric device.

Still a further important technical advantage of the present invention is that the switching, and temperature control circuits can be integrated into a conventional 12 volt DC thermoelectric device. In a specific application, if 12 volt DC is the most effective power source to operate a thermoelectric device, integration of the switching and temperature control circuit into the 12 volt DC thermoelectric device decreases the thermoelectric system's cost as well as increases its reliability and safety.

BRIEF DESCRIPTION OF THE DRAWINGS

For a more complete understanding of the present invention and the advantages thereof, reference is now made to the following descriptions taken in conjunction with the accompanying drawings in which.

DETAILED DESCRIPTION OF THE INVENTION

The preferred embodiments of the present invention and its advantages are best understood by referring to FIGS. 1 through 5 of the drawings, like numerals being used for like and corresponding parts of the various drawings.

Figure 1:
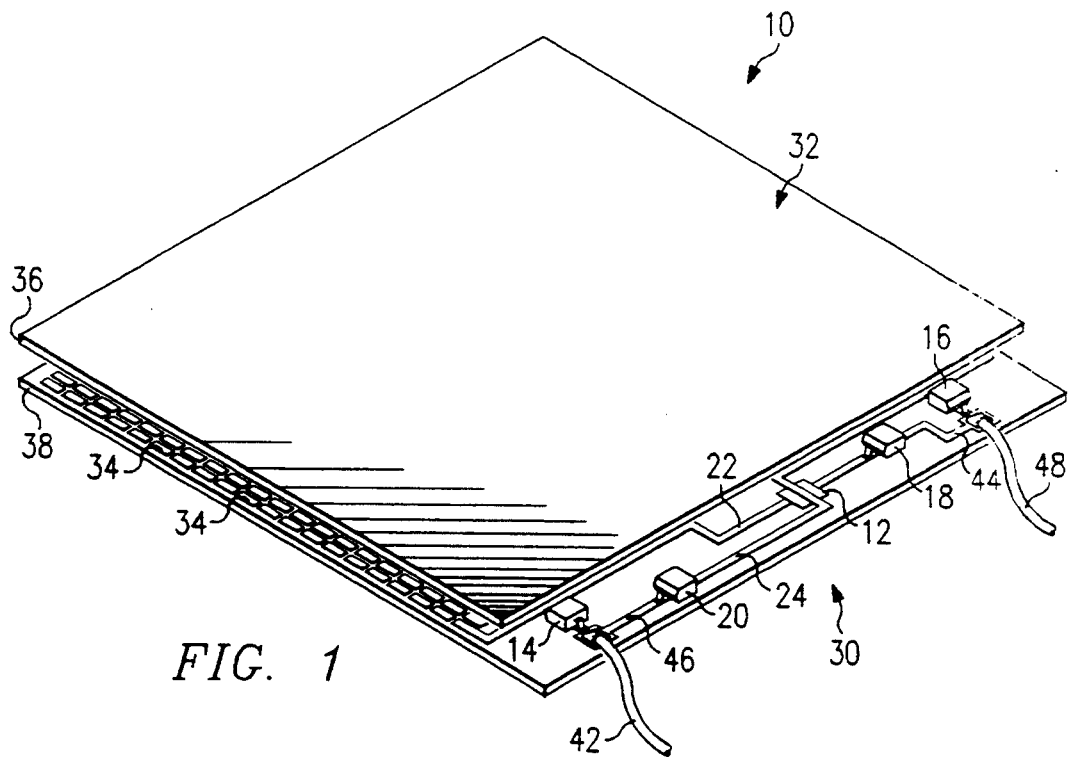
FIG. 1 is an isometric drawing which illustrates an integrated thermoelectric system with an integrated rectifier circuit for allowing AC input power operation according to the teachings of the present invention.

FIG. 1 illustrates thermoelectric system 10 with integrated rectifier circuit 30 for AC power operation according to the teachings of the present invention. As shown in FIG. 1, the integrated thermoelectric system 10 consists of thermoelectric device 32 placed between two thermally conductive but electrically isolated plates 36 and 38. Thermoelectric device 32 consists of an array of thermocouples (not shown in FIG. 1 for simplification) which are electrically connected in a serial manner from one output of integrated rectifier circuit 30 to the other output. Thermoelectric device 32 and its associated thermoelectric array are partially illustrated in FIG. 3.

Plate 36 is generally referred to as the "cold plate" and plate 38 is generally referred to as the "hot plate." In normal cooling mode, a mass or body (not shown) desired to be cooled will be thermally attached to plate 36. The body desired to be cooled will transfer its heat to plate 36. The thermocouples (not shown in FIG. 1 for simplification) move this heat energy from plate 36 to plate 38. The thermocouples are mechanically and thermally attached to plates 36 and 38 by a plurality of laminated pads 34. A thermal heat sink (not shown in FIG. 1 for simplification) may be thermally attached to plate 38 to receive the heat energy moving from plate 36 to plate 38. The heat sink will then radiate this heat energy to the surrounding medium.

As an alternative embodiment, thermoelectric system 10 may function as a heater by attaching a mass or body to hot plate 38 and an appropriate heat sink (often referred to as cold sink) to cold plate 36. Thus, the temperature of the mass or body attached to hot plate 38 may be raised to the desired level within the operating limits associated with thermoelectric system 10. Alternatively, the thermoelectric system may be modified to change from cooling to heating by reversing the direction of current flow through the associated thermocouple array while the mass or body remains attached to plate 36 and the heat sink remains attached to plate 38. This modifications may be accomplished by changing the wiring circuit by adding different electrical components, or by electrically switching means.

As shown in FIG. 1, AC power is applied to thermoelectric system 10 through electrical wires 42 and 48. Electrical wires 42 and 48 may be attached to electrically conductive strips 22 and 24 formed on a portion of plate 38. These electrically conductive strips 22 and 24 transmit the electrical power to the thermoelectric device 32 in thermoelectric system 10. Strips 22 and 24 mechanically attach the electrical devices to the dielectric plates, and aid in the heat-transfer function.

Integrated rectifier circuit 30 as shown in FIG. 1 consists of unidirectional current devices (UCD) 14, 16, 18 and 20, electrically conductive strips 22 and 24, and dielectric pad 12. In one embodiment of the present invention, UCDs 14, 16, 18 and 20 may be power switching diodes such as UPR20 Surface Mount Rectifier diodes available from Microsemi Corp. In another embodiment of the present invention, one or more of UCDs 14, 16, 18 and 20 may be semiconductor controlled rectifiers (SCR). Still another embodiment of the present invention includes the use of one or more triac devices as UCDs 14, 16, 18 and 20. A triac device is essentially two SCRs in parallel and facing in opposite directions. In another embodiment of the present invention, one or more UCDs 14, 16, 18 and 20 may be MOS-type devices. Further embodiments of the present invention include providing one or more of UCDs 14, 16, 18 and 20 to be surface-mount devices. Another embodiment of the present invention is for one or more of UCDs 14, 16, 18 and 20 to be semiconductor dies mounted directly to hot plate 38 or to cold plate 36. Finally, another embodiment of the present invention of for one or more through-hole devices may be used for UCDs 14, 16, 18 and 20.

FIG. 1 illustrates UCDs 14, 16, 18 and 20 as surface-mount power switching diodes. The tapered end represents the cathode of the diode, and the blunt end represents the anode of the diode. The cathode and anode are thermally and electrically bonded to the electrical interconnections through the two external metallic tabs shown UCDs in 14, 16, 18 and 20.

In FIG. 1, rectifier circuit 30 is configured for full-rectification of the incoming AC power. When the AC electrical power input is such that the voltage at wire 42 is greater than at wire 48, UCDs 14 and 16 are forward biased (conducting) and UCDs 18 and 20 are reversed biased (substantially non-conducting). When the AC electrical power input reverses polarity such that the voltage at wire 42 is less than the voltage at wire 48, UCDs 18 and 20 are forward biased (conducting) and UCDs 14 and 16 are reversed biased (substantially non-conducting). The result is a net current through thermoelectric device 32 in only one direction corresponding to the direction of net current flow through conductive strips 22 and 24.

In another embodiment of the present invention, if one of UCDs 14, 16, 18 and 20 shown in FIG. 1 are removed or if one of the interconnections, not common to device pairs 14 and 18 or 20 and 16, were broken or opened, rectifier circuit 30 will operate as a half-wave rectifier. That is, when the voltage across one of wires 42 or 48 was greater than the other wire, the current would flow through the thermocouples; but when the AC power input reverses polarity the current through the thermocouples would be substantially zero. The result of half-wave rectification is a net unidirectional current through the thermocouple array. But, the net current flow would be half of the amount produced by full-wave rectification. The heat-transfer across the thermocouple array is then reduced substantially by half-wave rectification as compared to full-wave rectification. The exact amount of heat-transfer will vary depending upon efficiency of thermoelectric system 10.

Figure 2:
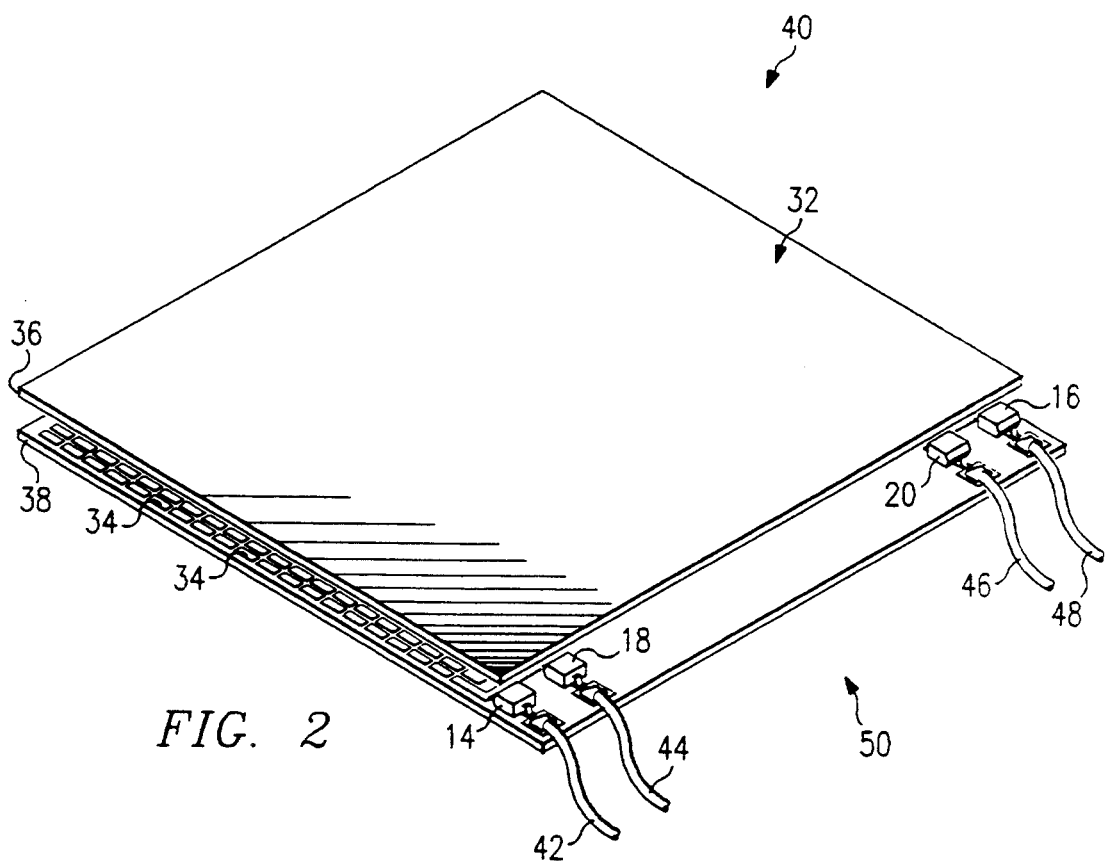
FIG. 2 is an isometric drawing which illustrates another embodiment of the present invention in which an alternative rectifier circuit is integrated into the thermoelectric device for AC input power operation including external switching from full-wave rectification to half-wave rectification of the incoming AC power signal.

FIG. 2 illustrates thermoelectric system 40 having another embodiment of the present invention in which rectifier circuit 50 is integrated into thermoelectric device 32 for AC input power operation. Four wired connections 42, 44, 46 and 48 are provided for external switching from full-wave rectification to half-wave rectification of the incoming AC power signal. In thermoelectric system 40, the AC input power to integrated rectifier circuit 50 and UCDs 14, 16, 18 and 20 may be configured externally such that thermoelectric system 40 operates with full-wave rectification and full heat-transfer or half-wave rectification and reduced heat-transfer. For operation in full-wave rectification mode, wires 42 and 46 should be electrically connected to the AC power source and wires 44 and 48 should be electrically connected to the AC power source. Another way of operating thermoelectric system 40 of FIG. 2 in full-wave rectification is for wires 42 and 48 to be electrically connected to the AC power source and for wires 44 and 46 to be electrically connected to the AC power source. The AC power will be applied to the two connected sets of wires for full-wave rectification.

For operation of thermoelectric system 40 in half-wave rectification mode, wires 42 and 44 should be electrically connected and wires 46 and 48 should be electrically connected. Alternatively, wires 42, 44, 46 and 48 may be manually configured for the desired heat-transfer rate by physically connecting the wires with solder or other means. Also, wires 42, 44, 46 and 48 can be mechanically configured for the desired heat-transfer rate using an external mechanical switch. In another embodiment of the present invention, wires 42, 44, 46 and 48 can be electrically configured for the desired heat-transfer rate using an external electrical switch such as a MOS-type switch or a BJT-type switch.

Figure 3:
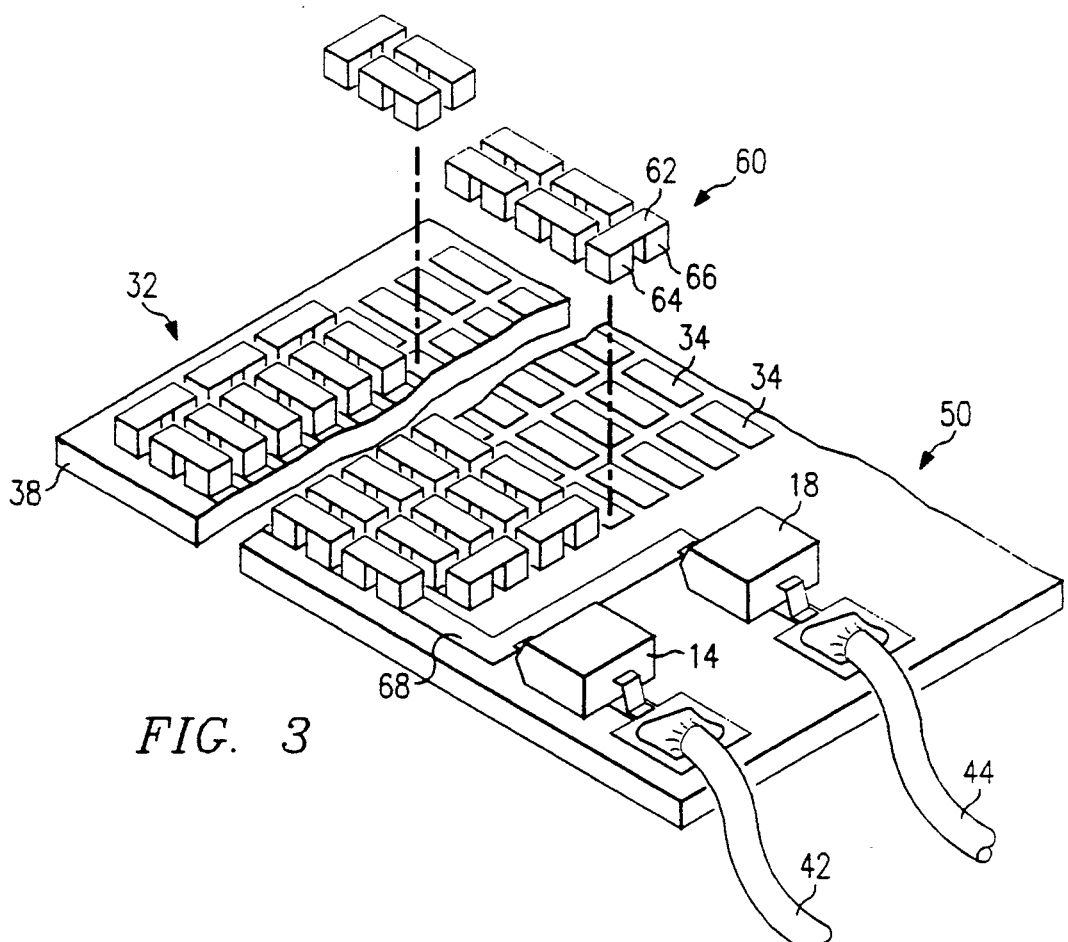
FIG. 3 is a exploded isometric view with portions broken away of the thermoelectric system of FIG. 2 illustrating the layout of a thermocouple array in a serial electrical connection and parallel thermal connection and the integration of the rectifier circuit into the associated thermoelectric device.

FIG. 3 is a exploded partial view of the present invention specifically illustrating the layout of the thermocouple array 60 in a serial electrical connection and parallel thermal connection and further illustrating the integration of rectifier circuit 50 into thermoelectric system 40. Complementary thermocouple pairs 60 consisting of an N-type thermocouple 64 and a P-type thermocouple 66 are connected by an electrically and thermally conductive material 62.

In one embodiment of the present invention, thermoelectric device 32, amenable to rectified 120 volt AC power, may be an array of 1056 thermocouples 60 configured in a serial electrical connection and a parallel thermal connection as shown in FIG. 3. The size of each N-type 64 and P-type 66 thermocouple may be approximately 0.025 inches long, 0.025 inches wide, and 0.035 inches high. The size and number of thermocouples 60 in thermocouple device 32 may be changed to accommodate different voltages, currents and heat-transfer rates. For example, in another embodiment of the present invention, thermoelectric device 32, amenable to rectified 240 volt AC power, may be an array of 2112 thermocouples 60 configured in a serial electrical connection and a parallel thermal connection as shown in FIG. 3. The size of each N-type 64 and P-type 66 thermocouple may be changed from the values above to accommodate various currents and heat transfer rates. FIG. 3 illustrates the technique of the present invention of achieving heat-transfer using rectified AC power. Rectifier circuit 50 (partially shown in FIG. 3) is configured and the AC power applied such that the net current through interconnect 68 is non-zero and unidirectional. In the present embodiment of the invention shown in FIG. 3, the thermocouple pairs are serially connected in a repetitive S pattern. Other configurations of the thermocouple pairs are possible so long as the electrical connection of the thermocouple pairs are serial and the thermal connection of the thermocouple pairs are parallel as shown in FIG. 3.

As the DC current passes through each thermocouple pair 60, it contributes to the net heat transfer. Thermocouple pairs 60 are attached to the dielectric substrate of plate 38 through a suitable mechanical bond between the thermocouple pairs and laminated pads 34. Thermoelectric system 40 is complete when plate 36 is bonded to the top of the thermocouples through bonding element 62. Thermocouple pairs 60 are thus sandwiched between plates 36 and 38. This achieves the parallel thermal connection of the N-type and P-type thermocouples to two plates 36 and 38.

Figure 4:
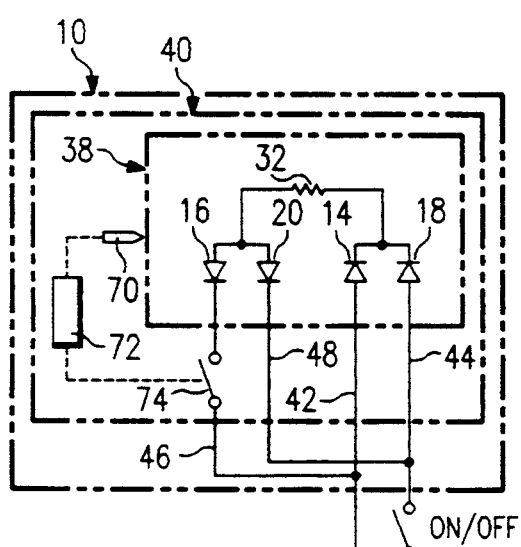
FIG. 4 is a schematic circuit diagram of the integrated thermoelectric system of FIG. 2 more specifically illustrating the integration of the rectifier circuit, a thermal sensor, and feedback, control and switching circuits into the associated thermoelectric device.

FIG. 4 is a circuit schematic of the integrated thermoelectric system more specifically illustrating the integration of the rectifier circuit, the thermal sensor, and the feedback, control and switching circuits into the thermoelectric device. In the present embodiment of the invention, some or all of these circuits are integrated into the thermoelectric device to constitute integrated thermoelectric system 40 or 10. Note in FIG. 4 that if the connections of 48 to 44 and of 46 to 42 are integrated into the thermoelectric system, thermoelectric system 40 becomes equivalent to thermoelectric system 10.

The thermal sensor 70 can be attached to either hot plate 38 or cold plate 36, or two thermal sensors can be attached to each plates 36 and 38. Thermal sensor 70 is more specifically attached to plates 36 and 38 for which temperature regulation is desired. Thermal sensor 70 will determine the temperature of the plate for feedback into control and switching circuits 72. Switching and control circuits 72 convert this thermal data into an electrical signal which is a function of the temperature of selected plates 36 or 38. This electrical signal switches switch 74 on and transmits full-rectified AC power to the thermocouple device when heat-transfer is necessary. Alternatively, this electrical signal switches switch 74 off and transmits half-rectified AC power when a reduction in the heat-transfer function of associated thermoelectric device 32 is necessary. The loop transfer function of thermocouple device 32, thermal sensor 70, feedback and control circuit 72, and power switch 74 are designed such that the temperature of selected plate 36 or 38 being regulated is kept substantially stable. Switch 74 can be placed not only at UCD 16, but also at UCD 20 or at either UCDs 14 or 18.

When electrical switch 74 is turned off, rectifier circuit 50 changes from full-wave rectification to half-wave rectification. When electrical switch 74 is turned on, rectifier circuit 50 changes from half-wave rectification to full-wave rectification. The switch affects the change in heat-transfer rate of the thermoelectric device from maximum heat-transfer (switch 74 on) to reduced heat-transfer (switch 74 off).

In another embodiment of the present invention, switch 74 is a mechanical switch. This mechanical switch may be a mechanical toggle switch, a jumper-wire configuration, or an interconnection which has been mechanically cut with a knife or laser-trimming system.

In another embodiment of the present invention, switch 74 is an electrical switch. The electrical switch is one which uses electrical energy to switch the electrical current through one or more of UCDs 14, 16, 18 and 20. Three examples of the many different types of switches which may be satisfactorily aced with the present invention are a MOSFET-type switch, a BJT-type switch, or a semiconductor relay.

In another embodiment of the present invention, switch 74 is an electrical switch integrated into one or more of UCDs 14, 16, 18 and 20. These switches operate in such a way that the integrated switch-diode is essentially a diode when the switch is on and operates as a substantially non-conducting open when the switch is off. The present embodiment may employ a semiconductor controlled rectifier or a triac as two of many examples.

In another embodiment of the present invention, switch 74 is an electro-mechanical switch such as an electro-mechanical relay or other configuration in which electrical energy is used to switch a mechanical switch.

In another embodiment of the present invention, switch 74 includes an integrated optical isolation element in order to isolate the noise in the thermoelectric device from the surrounding electronic circuit.

Figure 5:
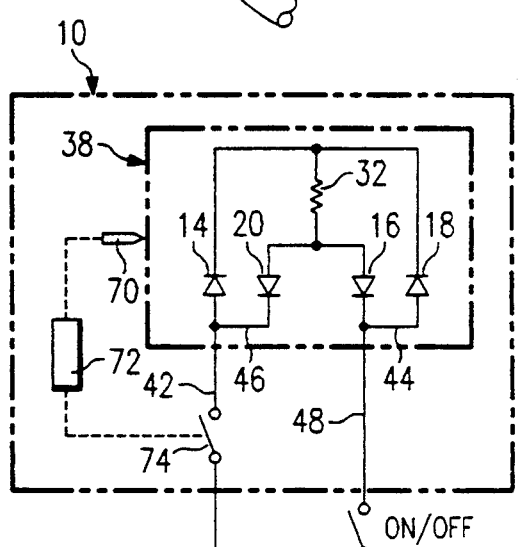
FIG. 5 is a schematic circuit diagram of another integrated thermoelectric system illustrating the integration of a rectifier circuit, thermal sensor, and feedback, control and switching circuits into a thermoelectric device and more specifically illustrating the interconnection of unidirectional current devices in a configuration which eliminates the crossover of interconnections of FIG. 1.

FIG. 5 is a circuit schematic of the integrated thermoelectric system illustrating the integration of the rectifier circuit, the thermal sensor, and the feedback, control and switching circuits into the thermoelectric device and more specifically illustrating the interconnection of the rectifier diodes in a configuration which eliminates crossover 12 of interconnections. As shown in FIG. 5, the layout of the serial connection of the thermocouple pairs can be configured in any pattern so long as the serial electrical connection begins at UCDs 14 and 18 in the rectifier circuit and ends at UCDs 16 and 20. Therefore in the present embodiment of the invention, interconnections between the integrated rectifier circuit and the thermocouple devices are routed around the thermocouple devices such that crossover 12 of interconnects 22 and 24 shown in FIG. 1 is eliminated.

Although the present invention and its advantages have been described in detail, it should be understood that various changes, substitutions and alterations can be made therein without departing from the spirit and scope of the invention as defined by the following claims.

What is claimed is:

1. A thermoelectric system comprising:
    an integrated thermoelectric device having an array of thermocouples arranged in a serial electrical connection and parallel thermal connection and arranged between a hot plate and a cold plate, the thermoelectric device further comprising:
    a rectifier circuit consisting of a plurality of unidirectional current devices interconnected and integrated into the thermoelectric device and operable to convert an AC power input to DC power applied to the thermocouple array; and
    a thermal sensor integrated into the thermoelectric device and operable to measure the temperature of the thermoelectric device;
    a feedback and control circuit operable to convert the temperature measurement of the thermal sensor to a control signal; and
    a switching circuit integrated into said device by mounting on one of said hot plate or said cold plate, and operable to switch the AC power from full power to half power responsive to the control signal so as to regulate the heat-transfer rate of the thermoelectric device.

2. The thermoelectric system of claim 1 further comprising:
    external wires attached to the rectifier circuit;
    wherein the rectifier circuit is partially interconnected to the thermoelectric device; and
    wherein the rectifier circuit may be configured as one of a half-wave rectifier and a full-wave rectifier by the external wires.

3. The thermoelectric system of claim 1 wherein the feedback and control circuit are integrated into the thermoelectric device.

4. The thermoelectric system of claim 1 wherein the switching circuit is integrated into the thermoelectric device.

5. The thermoelectric system of claim 1 wherein the switching circuit is integrated into the rectifier circuit and is further operable to control the amount of DC power into the thermoelectric device and associated heat-transfer rate of the thermoelectric device.

6. The thermoelectric system of claim 1 wherein the rectifier circuit is a semiconductor circuit integrated into the thermoelectric device.

7. The thermoelectric system of claim 1 wherein at least one of the unidirectional current devices comprises a triac so that the rectifier circuit is further operable to perform current switching, full-wave to half-wave rectifier-mode switching, and heating-cooling mode switching.

8. The thermoelectric system of claim 1, wherein at least one of the unidirectional current devices comprising a surface-mount device.

9. The thermoelectric system of claim 1, wherein at least one of the unidirectional current devices comprising a semiconductor die mounted directly to the thermoelectric device.

10. The thermoelectric system of claim 1, wherein at least one of the unidirectional current devices comprising a through-hole device.

11. A thermoelectric device comprising:
    an array of a number of thermocouples arranged in a serial electrical connection;
    a rectifier circuit having two output terminals and consisting of a plurality of unidirectional current devices interconnected and integrated into the thermoelectric device and operable to convert an AC power input to DC power applied to the thermocouple array with the thermocouple serial connection between the two output terminals of the rectifier circuit; and
    a thermal sensor integrated into the thermoelectric device and operable to measure a temperature of the thermoelectric device;
    a feedback and control circuit operable to convert the temperature measurement of the thermal sensor to a control signal;
    a switching circuit operable to switch the AC power from full power to half power responsive to the control signal so as to regulate the heat-transfer rate of the thermoelectric device; and wherein the array of thermocouples is arranged in a parallel thermal connection and wherein said array and said switching circuit are disposed between two electrically insulated and thermally conductive plates and wherein the number of thermocouples is selected to accept full-wave rectified 120 volt AC power at current values amenable to line currents.

12. The thermoelectric device as defined in claim 11 wherein the number of thermocouples in the thermocouple array comprises at least 1056 thermocouples disposed between the thermally conductive plates.

13. The thermoelectric device as defined in claim 11 wherein the thermocouple array comprises a plurality of thermocouples having a height less than one-third of an inch.

14. The thermoelectric device as defined in claim 11 wherein the thermocouple array comprises a plurality of thermocouples having a length less than one-fourth of an inch.

15. The thermoelectric device as defined in claim 11 wherein the thermocouple array comprises a plurality of thermocouples having a width less than one-fourth of an inch.

16. An integrated thermoelectric device operating on DC power comprising:
a pair of heat transfer plates;
an array of thermocouples arranged in a serial electrical connection and parallel thermal connection between the heat transfer plates;
a thermal sensor operable to measure a temperature of the thermoelectric device;
a feedback and control circuit operable to convert the temperature measurement of the thermal sensor to a voltage signal; and
a regulation circuit operable to regulate the DC power to the thermocouples responsive to the voltage signal so as to adjust the heat-transfer rate of the thermoelectric device wherein said regulation circuit is integrated into said thermoelectric device by mounting on one of said heat transfer plates.

17. The integrated DC thermoelectric device of claim 16 wherein the regulation circuit is a switching circuit operable to switch the DC current to the thermoelectric device off and on responsive to the voltage signal so as to regulate the heat-transfer rate.

18. The integrated DC thermoelectric device of claim 16 wherein the regulation circuit proportionally varies the DC current to the thermoelectric device responsive to the voltage signal so as to proportionally regulate the heat-transfer rate.

19. The thermoelectric system of claim 16, wherein at least one of the unidirectional current devices is a semiconductor switching diode.

20. The thermoelectric system of claim 16, wherein at least one of the unidirectional current devices is a semiconductor controlled rectifier incorporating current switching and full-wave to half-wave rectifier mode switching into the rectifier circuit.

21. A method for controlling a rate of heat-transfer by a thermoelectric device having a thermocouple array disposed between a hot plate and a cold plate, the method comprising the steps of:
providing AC input power to the thermoelectric device;
interconnecting an integrating a rectifier circuit, comprising a plurality of unidirectional current devices, into the thermoelectric device by mounting said rectifier circuit on one of said cold plate or said hot plate;
converting the AC power input into DC power with the rectifier circuit; and
applying the DC power to the thermocouple array so as to control the heat-transfer rate of the thermoelectric device.

22. The method of claim 21 further comprising the steps of:
measuring a temperature of the hot plate with a thermal sensor integrated into the thermoelectric device;
converting the temperature into an electrical signal;
switching the rectifier circuit of the thermoelectric device from full-wave rectification to half-wave rectification responsive to the electric signal to reduce the heat-transfer rate; and
switching the rectifier circuit of the thermoelectric device from half-wave rectification to full-wave rectification responsive to the electrical signal to maximize the heat-transfer rate.

23. The method of claim 21 further comprising the steps of:
measuring the temperature of the cold plate with the thermal sensor;
converting the temperature into an electrical signal;
switching the rectifier circuit of the thermoelectric device from full-wave rectification to half-wave rectification responsive to the electrical signal to reduce the heat-transfer rate; and
switching the rectifier circuit of the thermoelectric device from half-wave rectification to full-wave rectification responsive to the electrical signal to maximize the heat-transfer rate.

24. The method of claim 21 further comprising the step of providing 240 volt AC power to the thermoelectric device.

25. The method of claim 21 further comprising the step of providing 120 volt AC power to the thermoelectric device.

* * * * *